(12) United States Patent
Jang et al.

(10) Patent No.: US 6,797,619 B2
(45) Date of Patent: Sep. 28, 2004

(54) METHOD OF FORMING METAL WIRE OF SEMICONDUCTOR DEVICE

(75) Inventors: Hyun-jin Jang, Icheon-shi (KR); Jong-yoon Yoon, Seoul-shi (KR)

(73) Assignee: Hynix Semiconductor, Inc., Gyunggi-do (KR)

( * ) Notice: Subject to any disclaimer, the term of this patent is extended or adjusted under 35 U.S.C. 154(b) by 0 days.

(21) Appl. No.: 10/321,925

(22) Filed: Dec. 17, 2002

(65) Prior Publication Data

US 2003/0113999 A1 Jun. 19, 2003

(30) Foreign Application Priority Data

Dec. 18, 2001 (KR) ................................ 10-2001-0080860

(51) Int. Cl.[7] .............................................. H01L 21/44
(52) U.S. Cl. ...................................... 438/685; 438/685
(58) Field of Search ................................ 438/685, 653, 438/309, 257, 211, 201; 257/777, 507, 412, 354

(56) References Cited

U.S. PATENT DOCUMENTS 5,990,528 A    11/1999  Sundaresan ................. 257/393
6,074,812 A    6/2000   Hsu et al. .................... 438/668
6,475,847 B1 * 11/2002  Ngo et al. ................... 438/201

FOREIGN PATENT DOCUMENTS

JP    10-284617    10/1998
JP    11-297637    10/1999

* cited by examiner

Primary Examiner—Kamand Cuneo
Assistant Examiner—Monica D. Harrison
(74) Attorney, Agent, or Firm—Marshall, Gerstein & Borun LLP

(57) ABSTRACT

A method of forming a metal wire of a semiconductor device is disclosed. The method of forming a metal wire of a semiconductor device can reduce the junction leakage current caused by the reduction of the current resistance and can improve the reliability of the semiconductor device by adding the same dopant as that of a lower junction layer on the surface of a bit line contact before the deposition of the titanium film or the titanium nitride film, in order to maximize the diffusion of the dopant in the junction area consumed through heat treatment in the formation of the titanium silicide film and improve the contact resistance caused by the increase of the concentration of the dopant existing in the junction area.

22 Claims, 5 Drawing Sheets

METHOD OF FORMING METAL WIRE OF SEMICONDUCTOR DEVICE

BACKGROUND

1. Technical Field

Methods of forming metal wires of semiconductor devices are disclosed, and more particularly, methods of forming such metal wires which can reduce junction leakage current caused by a reduction of the current resistance and can improve the reliability of the semiconductor device by adding the same dopant as that of a lower junction layer on the surface of a bit line contact before the deposition of the titanium film or the titanium nitride film. As a result, the diffusion of the dopant in the junction area consumed through heat treatment in the formation of the titanium silicide film is maximized and the contact resistance caused by the increase in the concentration of the dopant in the junction area is improved.

2. Description of the Related Art

Generally, as the integration of a semiconductor device increases, the depth of a junction area and the size of the contact hole decrease. Therefore, it becomes difficult to adequately fill the contact hole in metal contact process. Thus the contact resistance is increased and the electrical properties of the device are deteriorated.

To solve this problem, a barrier metal layer containing titanium silicide ($TiSi_2$) is formed on the base of a contact hole by depositing titanium (Ti) and titanium nitride (TiN) and performing heat treatment thereon. In addition, with high integration of a semiconductor device, the formation of a metal wire having a low resistance is required. As materials of the metal wire, tungsten (W), aluminum (Al), titanium (Ti), cobalt (Co), zinc (Zn), copper (Cu), silicon (Si), platinum (Pt), aurum (Au) and the like are used. Among them, to reduce the fabrication cost, tungsten and aluminum are mainly used as they have a relatively low resistance and are easily deposited.

However, the more the device is integrated, the smaller the concentration of ions existing in the junction area. Thus the resistance of the metal wire increases gradually. Also, the contact area is reduced by the reduction of the contact size. This generates an additional problem increased contact resistance.

FIG. 1 is a cross-sectional view showing a method of forming a metal wire of a semiconductor device according to the conventional art.

Firstly, as illustrated in FIG. 1, an interlayer insulating film 12 is formed on a semiconductor substrate 10 in which a junction area 11 is formed. A contact hole is formed by etching a selected portion of the interlayer insulating film 12 to expose the junction area 11. Next, for electrical insulation with peripheral devices, a spacer insulating film 13 is formed on a side wall of the contact hole.

A metal barrier layer 16 is continuously formed by sequentially forming a titanium film 14 and a titanium nitride film 15 on top of the interlayer insulating film 12 including the contact hole by the sputtering method. Thereafter, a titanium silicide film 17 is formed on the base of the contact hole by carrying out the rapid thermal process (RTP) at an atmosphere of nitrogen ($N_2$) or ammonium ($NH_3$) gas. This titanium silicide film 17 is formed by the interaction between silicon atoms (Si) of the semiconductor substrate 10 and titanium atoms (Ti) of the titanium film 14 during the rapid thermal process.

Next, a tungsten layer 18 is deposited on the titanium nitride film 15 constituting the metal barrier layer 16 by the chemical vapor deposition (CVD). A metal wire (not shown), is formed by patterning this tungsten layer 18.

However, in the above-described conventional method of forming the metal wire or contact, the titanium silicide film 17 is formed on the interface between the titanium film 14 of a metal layer and a silicon semiconductor substrate 10. Accordingly, $B^+$ ions are diffused into the metal layer and the $B^+$ dopant in the metal-silicon interface is reduced, thereby increasing the resistance.

SUMMARY OF THE DISCLOSURE

Therefore, methods of forming metal wires or contact of semiconductor devices are disclosed which reduces the junction leakage current caused by the reduction of the current resistance and which improves the reliability of the semiconductor device by maximally depressing the diffusion of the dopant in the junction area consumed through heat treatment in the formation of the titanium silicide film and further which improves the contact resistance caused by the increase of the concentration of the dopant existing in the junction area.

One disclosed method of forming a metal wire of a semiconductor device comprises: forming an interlayer insulating film on a semiconductor substrate in which a junction area is formed; forming a contact hole to expose the junction area by etching the interlayer insulating film; forming a spacer insulating film on a side wall of the contact hole and adding the same dopant as that of a lower junction layer including the junction area; forming a metal barrier layer by sequentially depositing a titanium film and a titanium nitride film on the interlayer insulating film including the contact hole; forming a titanium silicide film on the resultant material having the metal barrier layer; and forming a metal wire by forming a tungsten layer on the titanium nitride film and patterning the tungsten layer.

Preferably, the titanium silicide film is formed by the rapid thermal process, and the tungsten layer is formed by the CVD method.

Preferably, addition of the same dopant as that of the lower junction layer and forming the titanium film and the titanium nitride film are carried out in-situ. The forming of the titanium nitride film on the titanium film is carried out in-situ after adding the same dopant as that of the lower junction layer and exposing the same to air for a predetermined time and then is deposited in-situ.

Preferably, the titanium silicide film is formed by performing the rapid thermal process at an atmosphere of nitrogen ($N_2$) or ammonium ($NH_3$) gas. The adding of the same dopant as that of the lower junction layer is carried out using the CVD plasma treatment or the rapid thermal process. At this time, the CVD plasma treatment is carried out over a time period ranging from about 1 to about 60 minutes at a temperature ranging from about 350° C. to about 800° C. using a RF power ranging from about 0.5 kW to about 5 kW.

Preferably, when adding the same dopant as that of the lower junction layer by the CVD plasma treatment, one of gases selected form $B_2H_6$ gas, $PH_3$ gas, and $BF_3$ gas is used as a processing gas. The step of adding the same dopant as that of the lower junction layer using the rapid thermal process is carried out over a time period ranging from about 60 seconds to about 60 minutes at a temperature ranging from about 650° C. to about 800° C. using a RF power ranging from about 0.5 kW to about 5 kW.

Preferably, when adding the same dopant as that of the lower junction layer using the rapid thermal process, one of gas selected form $B_2H_6$ gas, $PH_3$ gas, and $BF_3$ gas is used as a processing gas.

In accordance with another embodiment, a method of forming a metal wire of a semiconductor device comprises: forming an interlayer insulating film on a semiconductor substrate in which a junction area is formed; forming a contact hole to expose the junction area by etching the interlayer insulating film; depositing a titanium film on the interlayer insulating film including the contact hole; forming a spacer insulating film on a side wall of the contact hole and adding the same dopant as that of a lower junction layer including the junction area; forming a metal barrier layer by sequentially depositing a titanium nitride film on the titanium film added the same dopant as that of the lower junction layer; forming a titanium silicide film on the resultant material having the metal barrier layer; and forming a metal wire by forming a tungsten layer on the titanium nitride film and patterning the tungsten layer.

BRIEF DESCRIPTION OF THE DRAWINGS

The above features and advantages of the disclosed methods will become more apparent from the following detailed description when taken in conjunction with the accompanying drawings, wherein.

DETAILED DESCRIPTION OF THE PRESENTLY PREFERRED EMBODIMENTS

Figure 1:
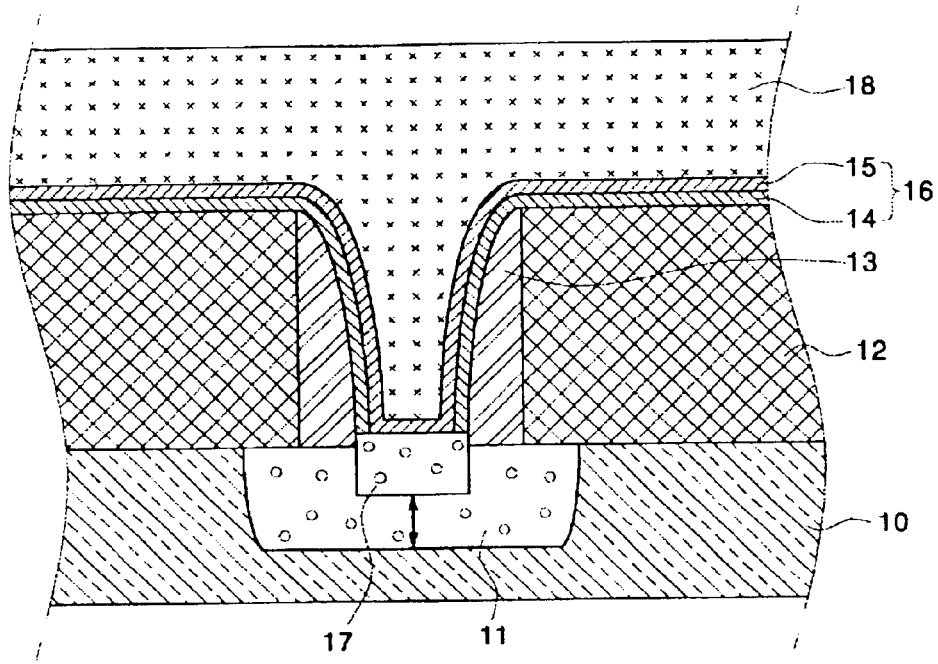
FIG. 1 is a cross-sectional view showing a method of forming a metal wire of a semiconductor device according to the conventional art.

Preferred embodiments of the disclosed methods will now be described with reference to the accompanying drawings. The preferred embodiments are intended to illustrate the principles of this disclosure, but not to limit the scope thereof. In the following description, same drawing reference numerals are used for the same elements as those of the conventional art.

Figure 2A:
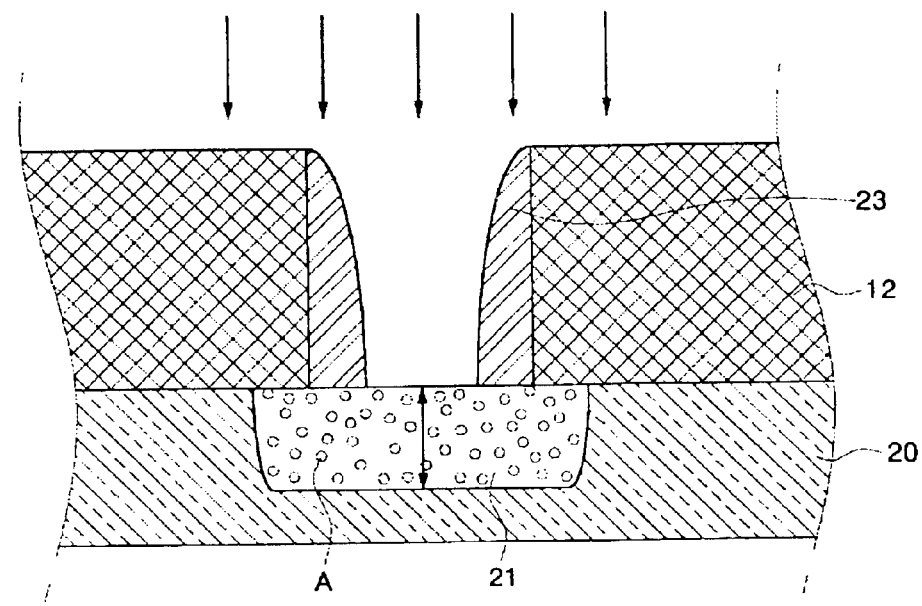
FIGS. 2a to 2c are cross-sectional views showing a method for forming a metal wire of a semiconductor device according to a first disclosed embodiment.
Figure 2B:
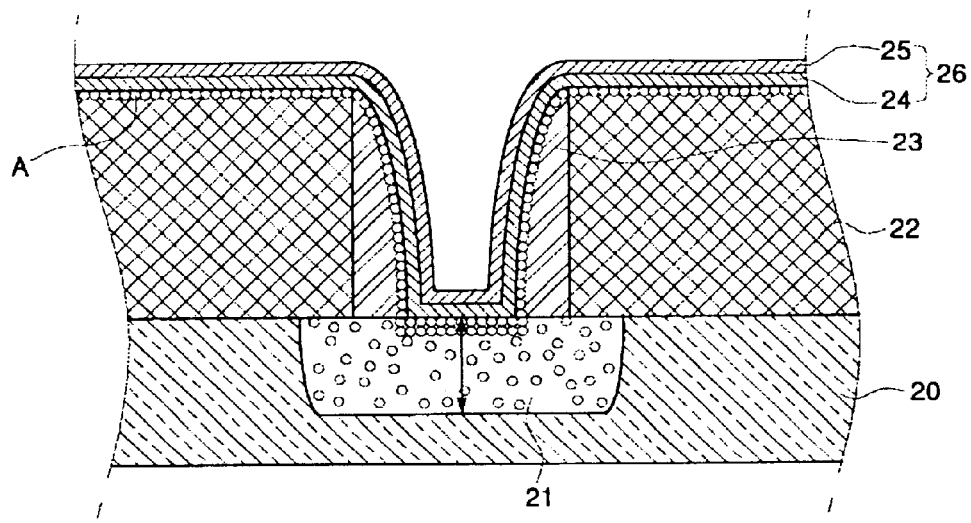
Figure 2C:
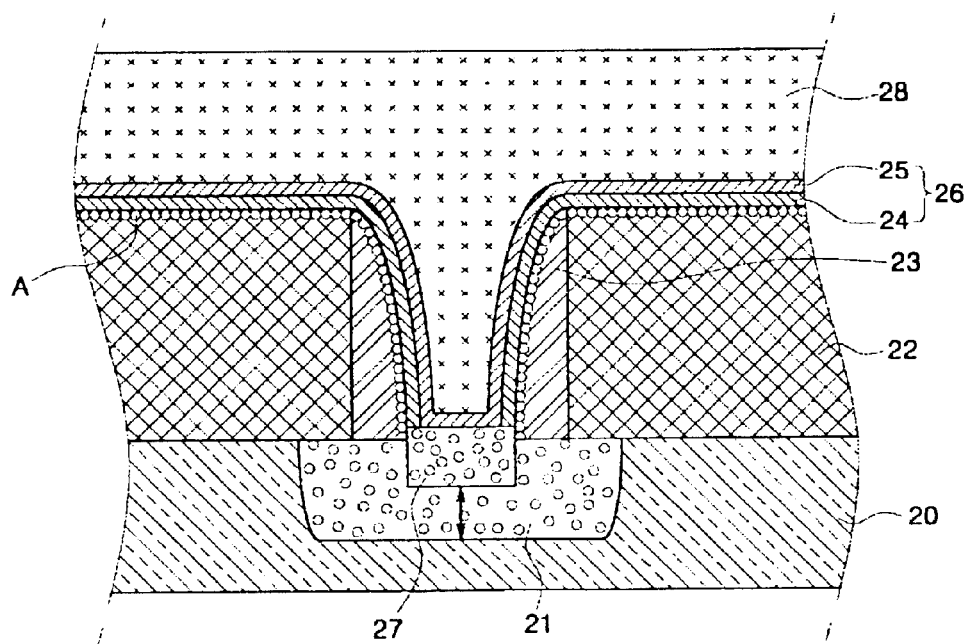

FIGS. 2a to 2c are cross-sectional views showing a method of forming a metal wire of a semiconductor device according to a first embodiment.

Firstly, as illustrated in FIG. 2a, a junction area 21 is formed on a semiconductor substrate 20 by carrying out plasma treatment using a $B_2H_6$ gas in a CVD chamber. At this time, the dopant (A) (for instance, $B^+$ generated from the $B_2H_6$ gas) is included in the junction area 21.

Next, an interlayer insulating film 22 is formed on the semiconductor substrate 20 in which the junction area 21 is formed. A contact hole is formed by etching a selected portion of the interlayer insulating film 22 to expose the junction area 21. Next, for electrical insulation with peripheral devices, a spacer insulating film 23 is formed on a side wall of the contact hole.

Next, plasma treatment is carried out using a $B_2H_6$ gas in a CVD chamber to add the same dopant as that of the junction area 21. At this time, it is preferred that the $B_2H_6$ plasma treatment is carried out over a time period ranging from about 1 to about 60 minutes at a temperature ranging from about 350° C. to about 800° C. using a RF power ranging from about 0.5 kW to about 5 kW.

In the first embodiment, the process of adding the same dopant as that of a lower junction layer including the junction area 21 to the interlayer insulating film 22 and the spacer insulating film 23 is performed in-situ.

Hence, as illustrated in FIG. 2b, dopant (A) (for instance, $B^+$ generated from the $B_2H_6$ gas) is uniformly distributed along the surfaces of the interlayer insulating film 22 including the contact hole and the surfaces of the spacer insulating film 23.

In the process of adding the same dopant as that in the lower junction layer to the interlayer insulating film 22 and the spacer insulating film 23, although the first embodiment of the present invention is performed by the CVD plasma treatment, but not limited thereto. That is, it is also possible to add the dopant using the rapid thermal process (RTP) at an atmosphere of nitrogen ($N_2$) or ammonium ($NH_3$) gas. Similarly with the CVD method, it is preferred that the process of adding the same dopant as that of a lower junction layer using the rapid thermal process is carried out over a time period ranging from about 1 to about 60 minutes at a temperature ranging from about 650° C. to about 800° C. using a RF power ranging from about 0.5 kW to about 5 kW.

In the case of adding the same dopant as that of the lower junction layer using the rapid thermal process, the processing gas preferably includes $B_2H_6$ gas similarly with the CVD method.

In the process of adding the same dopant as that of a lower junction layer to the interlayer insulating film 22 and the spacer insulating film 23 by the CVD plasma treatment, although the first embodiment is performed using $B_2H_6$ gas but not limited thereto. Namely, in the CVD plasma treatment process for adding the dopant, the processing gas may include $PH_3$ gas or $BF_3$ gas.

Similarly with the CVD method, in the processing of adding the same dopant as that of the lower junction layer using the rapid thermal process, the $PH_3$ gas or the $BF_3$ gas, instead of the $B_2H_6$ gas, can be used as the processing gas.

A metal barrier layer 26 is continuously formed by sequentially depositing a titanium film 24 and a titanium nitride film 25 on the interlayer insulating film 22 including the contact hole by the sputtering method. At this time, it is preferred that the titanium film 24 and the titanium nitride film 25 are deposited in si-tu.

Additionally, in the process of forming the titanium film 24 and the titanium nitride film 25 on the interlayer insulating film 22, it is preferred that the interlayer insulating film 22 and the spacer insulating film 23 to which the same dopant as that of the lower junction layer is added is exposed to air for a predetermined time and then are deposited in-situ.

Next, as illustrated in FIG. 2c, the rapid thermal process (RTP) is carried out at an atmosphere of nitrogen ($N_2$) or ammonium ($NH_3$) gas. By this, a titanium silicide film 27 is formed by the reaction of titanium ions and silicon ions on the interface between the titanium film 24 and the junction area 21.

Next, a tungsten layer 28 is formed on the titanium nitride film 25 constituting the metal barrier layer 26 by the chemical vapor deposition. A metal wire (not shown) is formed by patterning the tungsten layer 28.

Here, the tungsten layer 28 is preferably formed on the titanium nitride film 25 by the CVD method.

In the above-described method of forming a metal wire according to the first embodiment, the same dopant as that of the lower junction layer is added to the interlayer insulating film 22 and the spacer insulating film 23 before the formation of the titanium film 24, whereby the diffusion of the dopant in the junction area 21 consumed through heat treatment in the formation of the titanium suicide film 27 is depressed to the maximum and the concentration of the dopant existing in the junction area 21 is increased. Hence, the increase of the contact resistance experienced in the conventional art can be depressed and the junction leakage current can be reduced when the first embodiment of the disclosed method is utilized and as shown below, superior results are also obtained when the second embodiment is used as well.

Referring to FIG. 3, a method of forming a metal wire of a semiconductor device according to a second embodiment will now be described.

FIGS. 3a to 3e are cross-sectional views showing a method of forming a metal wire of a semiconductor device according to the second embodiment. The same drawing reference numerals are used for the same elements as those in the first embodiment illustrated in FIGS. 2a to 2c.

In the second embodiment, in order to maximize the depression of the diffusion of the dopant in the junction area consumed through heat treatment in the formation of the titanium silicide film to improve the contact resistance caused by the increase of the concentration of the dopant existing in the junction area, a method of adding the same dopant as that of a lower junction layer before the formation of a titanium nitride film is illustrated.

Figure 3A:
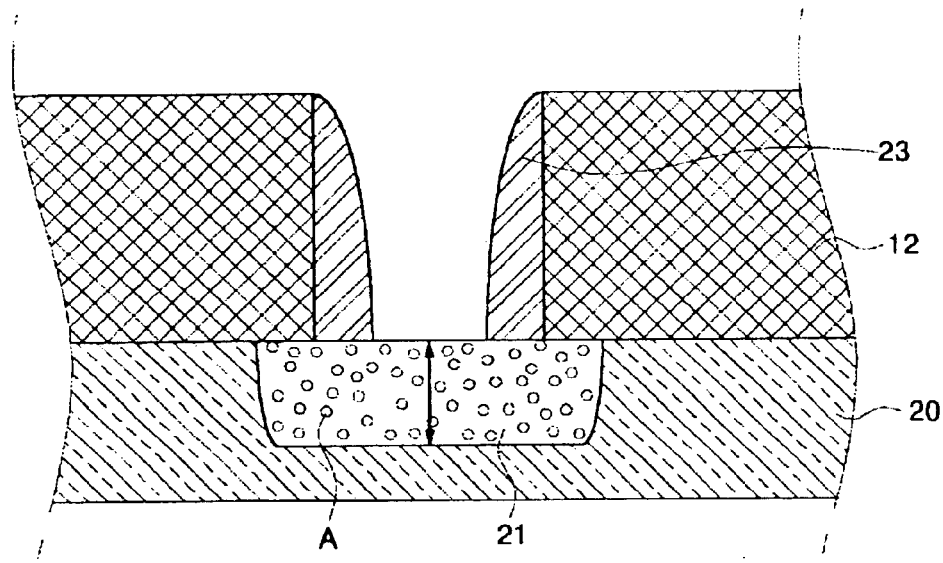
FIGS. 3a to 3e are cross-sectional views showing a method of forming a metal wire of a semiconductor device according to a second disclosed embodiment.

As illustrated in FIG. 3a, a junction area 21 is formed on a semiconductor substrate 20 by carrying out plasma treatment using $B_2H_6$ gas in a CVD chamber. At this time, dopant (A) (for instance, $B^+$ generated from the $B_2H_6$ gas) is included in the junction area 21.

Next, an interlayer insulating film 22 is formed on the semiconductor substrate 20 in which the junction area 21 is formed. A contact hole is formed by etching a selected portion of the interlayer insulating film 22 to expose the junction area 21. Thereafter, for electrical insulation with peripheral devices, a spacer insulating film 23 is formed on a side wall of the contact hole.

Figure 3B:
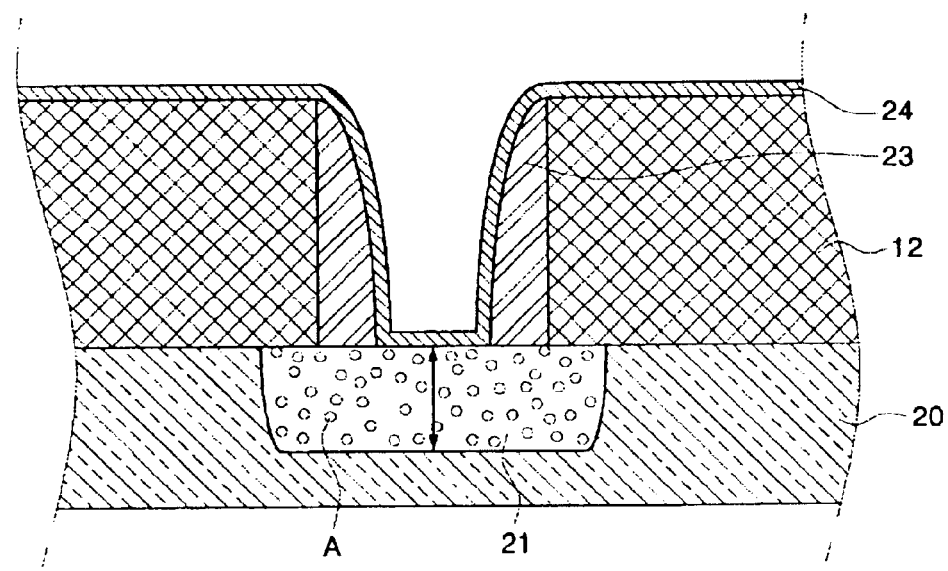

As illustrated in FIG. 3b, a titanium film 24 is continuously deposited on the interlayer insulating film 22 including the contact hole by the sputtering method.

Figure 3C:
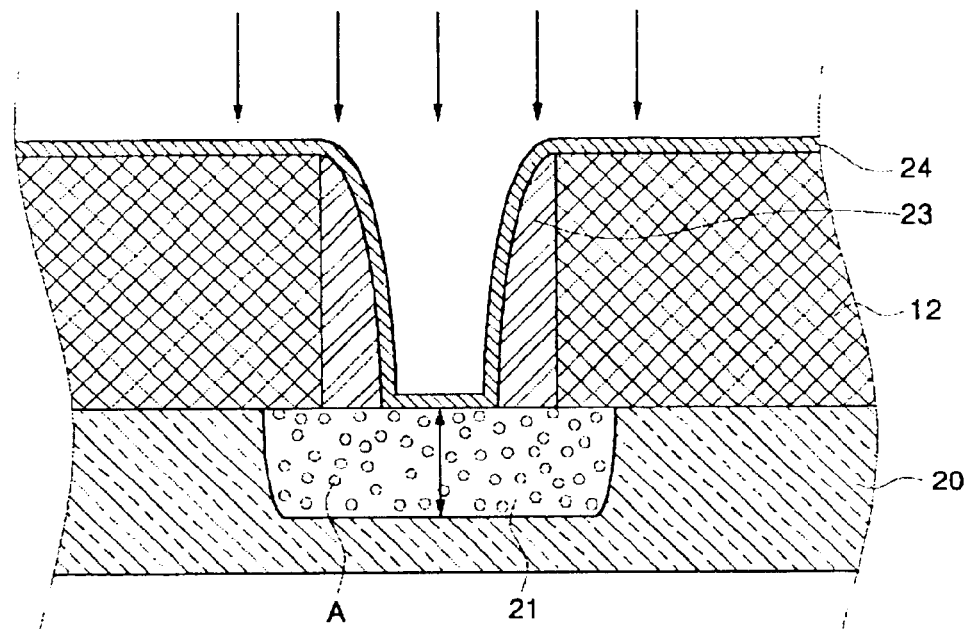

Next, as illustrated in FIG. 3c, in order to add the same dopant as that of the junction area 21, plasma treatment is carried out using the $B_2H_6$ gas in the CVD chamber. At this time, the $B_2H_6$ plasma treatment is carried out over a time period ranging from about 60 seconds to about 60 minutes at a temperature ranging from about 350° C. to about 800° C. using a RF power ranging from about 0.5 kW to about 5 kW.

In the second embodiment, the process of adding the same dopant as that of a lower junction layer including the junction area 21 to the interlayer insulating film 22 and the spacer insulating film 23 is performed in-situ.

In the process of adding the same dopant as that of a lower junction layer to the interlayer insulating film 22 and the spacer insulating film 23, although the second embodiment is performed by the CVD plasma treatment, but not limited thereto. That is, it is also possible to add the dopant using the rapid thermal process (RTP) in an atmosphere of nitrogen ($N_2$) or ammonium ($NH_3$) gas. Similarly with the CVD method, it is preferred that the process of adding the same dopant as that of a lower junction layer using the rapid thermal process is carried out over a time period ranging from about 1 to about 60 minutes at a temperature ranging from about 650° C. to about 800° C. using a RF power ranging from about 0.5 kW to about 5 kW.

In case of adding the same dopant as that of the lower junction layer using the rapid thermal process, the processing gas preferably includes one selected from $B_2H_6$ gas, $PH_3$ gas and $BF_3$ gas with the CVD method.

Figure 3D:
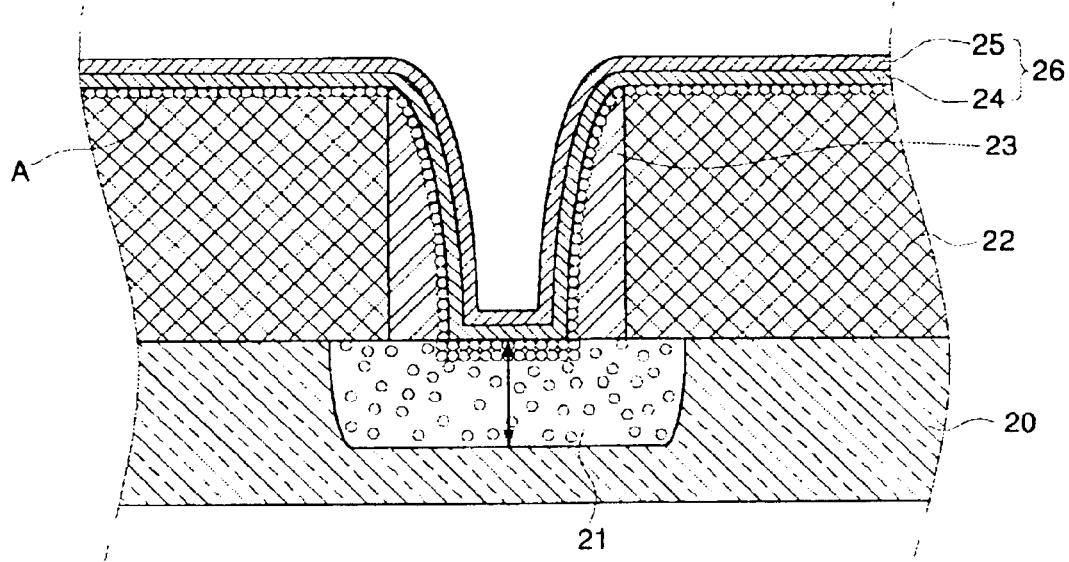

As illustrated in FIG. 3d, a metal barrier layer 26 is continuously formed by depositing a titanium nitride film 25, by a sputtering method.

At this time, it is preferred that the titanium nitride film 25 on the titanium film 24 be deposited in-situ. Also, it is preferred that the process of forming the titanium nitride film 25 on the titanium film 24 is carried out in-situ after adding the same dopant as that of the lower junction layer and exposing it to air for a predetermined time and then is deposited in-situ.

Figure 3E:
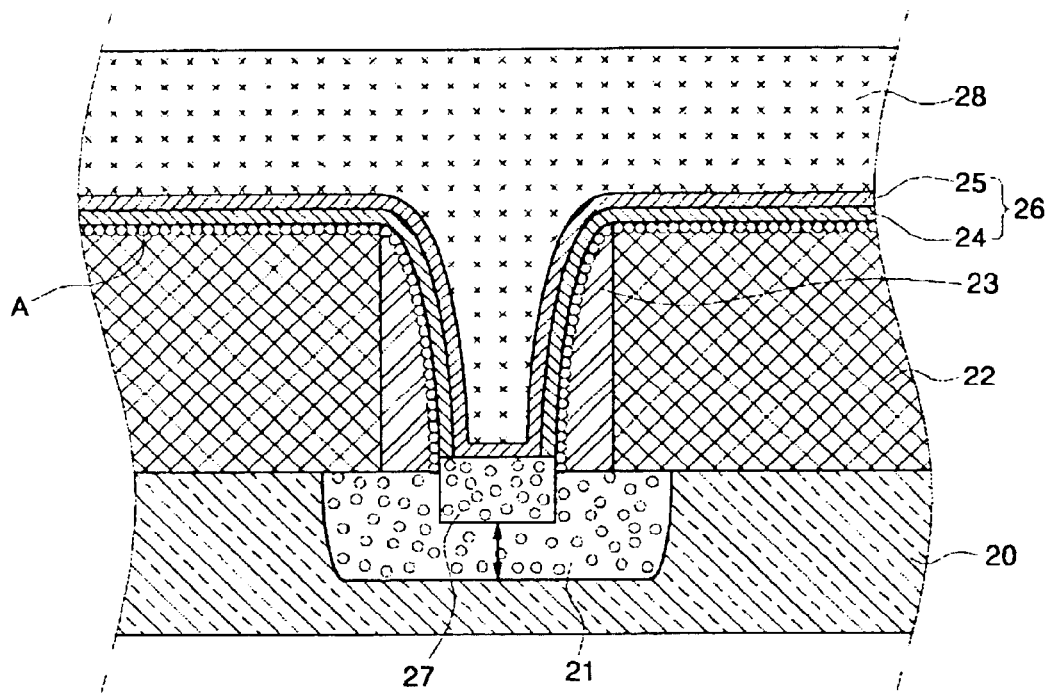

Next, as illustrated in FIG. 3e, the rapid thermal process (RTP) is carried out at an atmosphere of nitrogen ($N_2$) or ammonium ($NH_3$) gas. By this, a titanium silicide film 27 is formed by the reaction of titanium ions and silicon ions on the interface between the titanium film 24 and the junction area 21. Then, a tungsten layer 28 is formed on the titanium nitride film 25 constituting the metal barrier layer 26 by the chemical vapor deposition. A metal wire (not shown) is formed by patterning the tungsten layer 28. Here, the tungsten layer 28 is preferably formed on the titanium nitride film 25 by the CVD method.

In the above-described method of forming a metal wire according to the second embodiment, the same dopant as that of the lower junction layer is added before the formation of the titanium nitride film 25, whereby the diffusion of the dopant in the junction area 21 consumed through heat treatment in the formation of the titanium silicide film 27 is depressed to the maximum and the concentration of the dopant existing in the junction area 21 is increased. Hence, the increase of the contact resistance as in the conventional art can be depressed and the junction leakage current can be reduced.

According to the above-described methods, the junction leakage current caused by the reduction of the current resistance can be reduced and the reliability of the semiconductor device can be improved by adding the same dopant as that of a lower junction layer on the surface of a bit line contact before the deposition of the titanium film or the titanium nitride film.

What is claimed is:

1. A method of forming a metal wire of a semiconductor device comprising:

doping a junction area of a semiconductor substrate with a first dopant;

forming an interlayer insulating film on the junction area;

forming a contact hole with a side wall in the interlayer insulating film to expose the junction area by etching the interlayer insulating film;

forming a spacer insulating film on the side wall of the contact hole and doping the spacer insulating film and the junction area with said first dopant;

forming a metal barrier layer by sequentially depositing a titanium film and a titanium nitride film on the interlayer insulating film including the contact hole;

forming a titanium silicide film on the resultant material having the metal barrier layer; and forming a metal wire by forming a tungsten layer on the titanium nitride film and patterning the tungsten layer.

2. The method of claim 1, wherein the titanium silicide film is formed by a rapid thermal process.

3. The method of claim 1, wherein the tungsten layer is formed by a CVD method.

4. The method of claim 1, wherein the doping of the spacer insulating film and the junction area with said first dopant and the forming of the titanium film and the titanium nitride film are carried out in-situ.

5. The method of claim 1, wherein the forming of the titanium nitride film on the titanium film is carried out in-situ after the doping of the spacer insulating film and the junction area with said first dopant and exposing the same to air for a predetermined time and then is deposited in-situ.

6. The method of claim 1, wherein the titanium silicide film is formed by performing a rapid thermal process in an atmosphere of nitrogen ($N_2$) or ammonium ($NH_3$) gas.

7. The method of claim 1, wherein the doping of the spacer insulating film and the junction area with said first dopant is carried out using a CVD plasma treatment or a rapid thermal process.

8. The method of claim 7, wherein the CVD plasma treatment is carried out over a time period ranging from about 1 to about 60 minutes at a temperature ranging from about 350° C. to about 800° C. using a RF power ranging from about 0.5 kW to about 5 kW.

9. The method of claim 8, wherein, $B_2H_6$ gas is used as a processing gas in the CVD plasma treatment.

10. The method of claim 8, wherein, $PH_3$ gas or $BF_3$ gas is used as a processing gas in the CVD plasma treatment.

11. The method of claim 7, wherein the rapid thermal process is carried out over a time period ranging from about 1 to about 60 minutes at a temperature ranging from about 650° C. to about 800° C. using a RF power ranging from about 0.5 kW to about 5 kW.

12. The method of claim 11, wherein, when $B_2H_6$ gas is used as a processing gas in the rapid thermal process.

13. The method of claim 11, wherein, $PH_3$ gas or $BF_3$ gas is used as a processing gas in the rapid thermal process.

14. A method of forming a metal wire of a semiconductor device comprising:

doping a junction area at a semiconductor substrate with a first dopant;

forming an interlayer insulating film on the junction area;

forming a contact hole with a sidewall in the interlayer insulating film to expose the junction area by etching the interlayer insulating film;

depositing a titanium film on the interlayer insulating film including the contact hole;

forming a spacer insulating film on the side wall of the contact hole and doping the spacer insulating film and junction area with said first dopant;

forming a metal barrier layer by sequentially depositing a titanium nitride film on the titanium film;

forming a titanium silicide film on the metal barrier layer; and forming a metal wire by forming a tungsten layer on the titanium nitride film and patterning the tungsten layer.

15. The method of claim 14, wherein the titanium silicide film is formed by performing the rapid thermal process at an atmosphere of nitrogen ($N_2$) or ammonium ($NH_3$) gas.

16. The method of claim 14, wherein the tungsten layer is formed by the CVD method.

17. The method of claim 14, wherein the forming of the titanium film and the titanium nitride film are carried out in-situ, and the forming of the titanium nitride film on the titanium film is carried out in-situ after the doping of the spacer insulating film and the junction area with said first dopant and exposing the same to air for a predetermined time.

18. The method of claim 14, wherein the doping of the spacer insulating film and the junction area with said first dopant is carried out using the CVD plasma treatment or the rapid thermal process.

19. The method of claim 18, wherein the CVD plasma treatment is carried out over a time period ranging from about 1 to about 60 minutes at a temperature ranging from about 350° C. to about 800° C. using a RF power ranging from about 0.5 kW to about 5 kW.

20. The method of claim 19, further comprising using a gas selected from $B_2H_6$ gas, $PH_3$ gas, and $BF_3$ gas is used as a processing gas in the CVD plasma treatment.

21. The method of claim 18, wherein the doping of the spacer insulating film and the junction area with said first dopant using the rapid thermal process is carried out over a time period ranging from about 1 to about 60 minutes at a temperature ranging from about 650° C. to about 800° C. using a RF power ranging from about 0.5 kW to about 5 kW.

22. The method of claim 21, further comprising using a gas selected form $B_2H_6$ gas, $PH_3$ gas or $BF_3$ gas is used as a processing gas in the rapid thermal process.

* * * * *